United States Patent [19]
Notani et al.

[11] Patent Number: 5,294,897
[45] Date of Patent: Mar. 15, 1994

[54] MICROWAVE IC PACKAGE

[75] Inventors: Yoshihiro Notani; Takayuki Katoh, both of Itami, Japan

[73] Assignee: Mitsubishi Denki Kabushiki Kaisha, Tokyo, Japan

[21] Appl. No.: 996,619

[22] Filed: Dec. 24, 1992

[30] Foreign Application Priority Data

Jul. 20, 1992 [JP] Japan .................. 4-215623

[51] Int. Cl.⁵ .................................. H01P 5/00
[52] U.S. Cl. ............................. 333/33; 29/832; 29/841; 257/676; 257/728; 333/246; 333/247
[58] Field of Search ............ 333/238, 246, 247, 260, 333/33; 257/664, 676, 773, 776, 728; 29/832, 841, 846, 847, 853

[56] References Cited

U.S. PATENT DOCUMENTS

| | | | |
|---|---|---|---|
| 3,303,439 | 2/1967 | Fulp | 333/246 |
| 4,543,544 | 9/1985 | Ziegner | 333/238 X |
| 4,600,907 | 7/1986 | Grellman et al. | 333/246 |
| 4,626,805 | 12/1986 | Jones | 333/33 |
| 4,806,892 | 2/1989 | Thorpe et al. | 333/246 |
| 5,229,727 | 7/1993 | Clark et al. | 333/33 |
| 5,235,208 | 8/1993 | Katoh | 257/728 X |

FOREIGN PATENT DOCUMENTS

| | | |
|---|---|---|
| 2-156702 | 6/1990 | Japan . |
| 2-106707 | 8/1990 | Japan . |
| 68156 | 3/1991 | Japan ................. 257/728 |
| 4-25036 | 1/1992 | Japan . |
| 4-38855 | 2/1992 | Japan . |

*Primary Examiner*—Paul Gensler
*Attorney, Agent, or Firm*—Leydig, Voit & Mayer

[57] ABSTRACT

A surface mountable microwave IC package includes a dielectric substrate; a ground conductor disposed on a front surface of a dielectric substrate on which a microwave IC chip is disposed and grounded; and a transmission line for connecting the microwave IC chip to a coplanar line on a package substrate outside the microwave IC package. The upper coplanar line is disposed on the front surface of the dielectric substrate and includes the ground conductor on which the IC chip is disposed. The lower coplanar line is disposed on the rear surface of the dielectric substrate. The intermediate coplanar line penetrates through the dielectric substrate and connects the upper coplanar line to the lower coplanar line. Therefore, the microwave transmission path from the package substrate to the IC chip is a coplanar transmission line so that a continuous transmission mode is maintained through the microwave transmission path. As a result, reflection of high frequency signals caused by the mismatching of characteristic impedances in the microwave transmission line is significantly reduced.

9 Claims, 12 Drawing Sheets

MICROWAVE IC PACKAGE

FIELD OF THE INVENTION

The present invention relates to microwave IC packages and, more particularly, to surface mountable microwave IC packages including high frequency signal transmission lines.

BACKGROUND OF THE INVENTION

Generally, a semiconductor device is fabricated by sealing a semiconductor IC chip in a prescribed package and mounting the package on a package substrate. There are various kinds of packages according to the respective uses and kinds of IC chips included therein.

FIG. 9(a) is a perspective view illustrating a general-purpose plastic molded package a an example of the above-described semiconductor IC packages. In FIG. 9(a), reference numeral 700 designates the plastic molded package. A semiconductor IC chip 3 is disposed on a die pad of a lead frame, and electrode pads of the IC chip 3 are connected to lead terminals of the lead frame by bonding wires or the like. Then, the IC chip 3 on the lead frame is encapsulated in a molded plastic 701, and external lead terminals 702 are downwardly bent with respect to the plane surface of the lead frame on which the chip 3 is disposed. The external lead terminals 702 thus bent serve as lead pins for connecting the package 700 to a package substrate.

A method of mounting the plastic molded package 700 on the package substrate will be described. Initially, a printed circuit board (not shown) is prepared. A conductive layer having a prescribed wiring pattern is printed on the rear surface of the board and holes for the lead pins 702 of the package 700 are formed through the board. Then, end portions 702a of the lead pins 702 are inserted in the through-holes from the surface side of the printed circuit board and connected to the conductive layer on the rear surface of the board by solder or the like.

In the above-described method for mounting the conventional package 700, however, since the lead pins 702 of the package are connected to the conductive layer on the rear surface of the printed circuit board, the package is mounted on only one side of the printed circuit board so that high-density mounting is not achieved.

In order to solve this problem, surface mountable packages have been used in recent years. FIG. 9(b) is a perspective view illustrating the conventional surface mountable package disclosed in Japanese Published Patent Application No. 4-25036. In FIG. 9(b), reference numeral 600 designates the surface mountable package. Lead pins 602 are bent so that end portions 602a are level with the rear surface of the plastic package 601. When the package is mounted on a package substrate, the end portions 602a are put on a conductive layer on the surface of the package substrate and adhered to the conductive layer by solder or the like, whereby the lead pins and the wiring on the package substrate are connected to each other on the surface of the package substrate whereon the package is mounted. That is, packages can be mounted on both surfaces of the package substrate.

In addition, the surface mountable package 600 can be filled with a high frequency semiconductor IC chip (hereinafter referred to as microwave IC chip) using the lead pins 602 appropriately as grounding pins or signal pins. In this case, however, since the lead pins 602 are merely wires, the line inductance of each lead pin significantly increases in a high frequency band, thereby deteriorating performance of the microwave IC chip. In order to solve the problem in the high frequency band, there is a microwave IC package in which a coplanar line including a grounding lead pin and a signal lead pin which are connected to a grounding terminal and a signal terminal of the IC chip by bonding wires, respectively. The above-described Japanese Published Patent Application No. 4-25036 also discloses a microwave IC package of this kind.

In the above-described surface mountable package, however, the molded plastic having a certain dielectric constant is closely adhered to the microwave IC chip, so that characteristics of the IC chip in the design stage are unfavorably changed or deteriorated due to the molded plastic. In addition, the lead frame and the IC chip are encapsulated together in the molded plastic after the die bonding and the wire bonding are performed, so that the packaging is complicated. Therefore, it is difficult to provide a plurality of IC packages including different function IC chips in a short time in compliance with the requests of the user.

In order to solve the above-described problems, an improved surface mountable package has been developed, which can complete the packaging by only disposing a microwave IC chip on a package body and putting a lid thereon. This package avoids deterioration in the characteristics of the microwave IC chip and promptly meets the user's demand.

FIGS. 10, 11(a)–11(c), and 12(a)–12(b) are diagrams for explaining the improved surface mountable microwave IC package. More specifically, FIG. 10 is a perspective view, partly broken away, illustrating the external appearance and the internal structure of the package. FIG. 11(a) is a bottom view of the package, FIG. 11(b) is a side elevational view thereof, and FIG. 11(c) is a cross-sectional view taken along a line XIc—XIc of FIG. 11(a). FIGS. 12(a) and 12(b) are a perspective view and a front elevational view, respectively, for explaining a method of mounting the package on a package substrate.

In these figures, a surface mountable package 500 comprises a package body 501 on which a microwave IC chip 1 is disposed and a lid 590 put on the package body 501.

The package body 501 comprises a ceramic substrate 501a and a ground conductor layer 501b. Portions of the ground conductor layer 501b are selectively removed to form U-shaped gaps 502a and 502b, whereby an input side coplanar transmission line part 550 and an output side coplanar transmission line part 560 are formed, respectively.

More specifically, a portion 552 of the conductor layer 501b surrounded by the U-shaped gap 502a serves as a coplanar signal conductor of the input side coplanar transmission line part 550, and portions 551 and 553 of the conductor layer 501b serve as ground conductors. Similarly, a portion 562 of the conductor layer 501b surrounded by the U-shaped gap 502b serves as a coplanar signal conductor of the output side coplanar transmission line part 560, and portions 561 and 563 of the conductor layer 501b serve as ground conductors. As shown in FIG. 11(b), a width W of the coplanar signal conductor 552 (562) and intervals G between the signal conductor 552 (562) and the ground conductors 551 and 553 (561 and 563) are chosen so that characteristic impedance of the coplanar transmission line part 550 (560) is 50Ω.

The input side signal conductor 552 and the output side signal conductor 562 are connected to an input side signal lead 512 and an output side signal lead 522, respectively. The input side ground conductors 551 and 553 and the output side ground conductors 561 and 563 are connected to input side ground leads 511 and 513 and output side ground leads 521 and 523. An input terminal 510 comprises the leads 511 to 513 and an output terminal 520 comprises the leads 521 to 523. When the package is mounted on a package substrate 601, the input and output terminals 510 and 520 are connected to coplanar transmission lines 610 and 620 on the package substrate, respectively.

Meanwhile, on the surface of the ceramic substrate 501a, conductor layers 503a and 503b are disposed at positions opposite to the coplanar signal conductors 552 and 562, respectively. The conductor layer 503a serves as a strip signal conductor of the input side microstrip transmission line part 570, and portions of the ceramic substrate 501a opposite to the portions 551 and 553 of the ground conductor layer 501b serve as ground conductors of the input side microstrip transmission line part 570. Similarly, the conductor layer 503b serves as a strip signal conductor of the output side microstrip transmission line part 580, and portions of the ceramic substrate 501a opposite to the portions 561 and 563 of the ground conductor layer 501b serve as ground conductors of the output side microstrip transmission line part 580. The width of the strip signal conductor 503a (503b) and the thickness and a dielectric constant of the ceramic substrate 501a are appropriately chosen so that the characteristic impedance of the microstrip transmission line part 570 (580) is 50Ω. In addition, the strip signal conductors 503a and 503b on the surface of the ceramic substrate 501a are connected to the coplanar transmission lines 552 and 562 on the rear surface of the ceramic substrate via through-holes 504a and 504b filled with a conductive material, respectively.

Through-holes 505 filled with a conductive material are located in a region of the ceramic substrate 501a where the microwave IC chip 1 is disposed. When the IC chip 1 is disposed on the region of the ceramic substrate 501a, a ground conductor film 1a of the IC chip 1 is connected to the ground conductor layer 501b on the rear surface of the package via the through-holes 505.

A description is given of a method for mounting the microwave IC package on the package substrate.

Initially, the microwave IC chip 1 is adhered to the package body 501 with a conductive adhesive or the like, and input and output side electrode pads (not shown) on the surface of the chip 1 are connected to the input and output side strip signal conductors 503a and 503b by bonding wires 2a and 2b, respectively. Then, the lid 590 is put on the package body 501 and adhered to the package body with an adhesive or the like. The lid 590 provides both a hermetic seal and shielding.

Then, as illustrated in FIG. 12(a), the microwave IC package 500 is mounted on the package substrate 601. On the package substrate 601, are disposed a coplanar transmission line 610 for applying microwave signals to the microwave IC chip 1 and a coplanar transmission line 620 for transferring microwave signals from the IC chip 1 to the subsequent stage. The coplanar transmission lines 610 and 620 are connected to the input terminal 510 and the output terminal 520 of the package 500, respectively.

More specifically, when the microwave IC package 500 is put at a prescribed position of the package substrate 601, the signal lead 512 of the input terminal 510 contacts the signal conductor 612 of the coplanar transmission line 610 while the signal lead 522 of the terminal 520 contacts signal conductor 622 of the coplanar transmission line part 620. The ground leads 511 and 513 of the input terminal 510 contact the ground conductors 611 and 613 of the coplanar transmission line 610 while the ground leads 521 and 523 of the output terminal 520 contact the ground conductors 621 and 623 of the coplanar transmission line 620. Then, the respective contacting parts are fixed by solder or the like, whereby the microwave IC package 500 is mounted on the package substrate 601.

Then, another microwave IC package 500 is mounted on the rear surface of the package substrate 601 in the same manner as described above (FIG. 12(b)). In this way, microwave IC packages 500 are mounted on both surfaces of the package substrate 601, resulting in a high-density mounting hybrid IC.

Japanese Published Patent Application No. 2-106707 discloses a hybrid IC in which an end of a microstrip line on a package substrate is used as a terminal for an I/O interface with an external circuit.

In the microwave IC package 500 thus mounted on the package substrate 601, a microwave input applied to the input terminal 510 from the signal supply side coplanar line 610 travels through the input side coplanar transmission line part 550 on the rear surface of the package body and the through-hole 504a and reaches the input side microstrip transmission line part 570 on the surface of the package body. Then, the microwave signal travels through the bonding wire 2a to reach the microwave IC chip 1.

Thereafter, the microwave signal is subjected to a prescribed signal processing, for example, amplification, switching, phase modification, or the like according to the function of the IC chip, and then it is output from the IC chip 1. The microwave signal output travels through the bonding wire 2b, the output side microstrip transmission line part 580, and the through-hole 504b to reach the output side coplanar transmission line part 560. Then, it is output to the signal transfer side coplanar line 620 on the package substrate 601 from the output terminal 520 of the package 500.

In the prior art surface mountable microwave IC package 500, the strip signal conductors 503a and 503b disposed on the surface of the ceramic substrate 501a are connected to the coplanar signal conductors 552 and 562 on the rear surface of the ceramic substrate 501a by the through-holes 504a and 504b which are filled with conductive material. However, the through-holes merely connect these signal conductors of the microwave transmission lines on the opposite surfaces of the ceramic substrate, and a microwave transmission line comprising the signal conductor and the ground conductors having a matched characteristic impedance is not achieved. That is, the through-holes 504a and 504b cause discontinuities in the microwave transmission lines from the input and output terminals 510 and 520 to the microwave IC chip 1, respectively, and mismatching of characteristic impedances occurs between the through-hole and the transmission line before or behind the through-hole, with the result that reflection of the microwave signal unfavorably increases.

Meanwhile, Japanese Published Patent Application No. 2-156702 discloses another microwave IC package provided with input and output side strip lines comprising ground conductor layers disposed on the surface of a dielectric substrate and strip conductors disposed on the rear surface of the substrate, in place of the input and output side coplanar transmission parts 550 and 560 and the input and output side microstrip transmission parts 570 and 580 of the microwave IC package described with respect to FIGS. 10~12. Also in this IC package, the strip conductors on the rear surface of the dielectric substrate are connected to the microwave IC chip by through-holes penetrating the dielectric substrate, so that the through-holes cause discontinuities in the transmission lines, whereby mismatching of characteristic impedances occurs between the through-hole and the transmission line before or after the through-hole.

Furthermore, Japanese Published Patent Application No. 4-38855 discloses another microwave IC package in which a microwave IC chip is disposed on a package body and dielectric films whereon coplanar lines are formed are provided as input and output terminals of the package. In this structure, a continuous transmission mode is obtained through the microwave transmission line from the transmission line on the package substrate to the microwave IC chip, but the connection between the coplanar line on the dielectric film and the coplanar line on the package substrate is not easily made by solder or the like because the dielectric film should be pressed onto the package substrate by pressure means.

SUMMARY OF THE INVENTION

It is an object of the present invention to provide a microwave IC package in which a transmission line on the rear surface of a dielectric substrate is connected to a transmission line on the front surface of the substrate while maintaining a continuous transmission mode between the transmission lines and which is easily mounted on a package substrate with solder or the like.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, in a microwave IC package, a substrate on which a microwave IC chip is to be disposed comprises a dielectric substrate body, a ground conductor disposed on a surface of the dielectric substrate, whereon a microwave IC chip is disposed and grounded, and a transmission line for connecting the microwave IC chip to a coplanar line on a package substrate outside the microwave IC package. The transmission line has a coplanar line structure comprising a signal conductor and a ground conductor, and it comprises upper, lower, and intermediate coplanar lines. The upper coplanar line is disposed on the surface of the dielectric substrate and includes a ground conductor which is a part of the ground conductor on which the IC chip is disposed. The lower coplanar line is disposed on the rear surface of the dielectric substrate so that it can be connected to the coplanar line on the package substrate. The intermediate coplanar line penetrates through the dielectric substrate and connects the upper coplanar line to the lower coplanar line. Therefore, the microwave transmission path from the package substrate outside the package to the microwave IC chip inside the package includes a coplanar transmission line, so that a continuous transmission mode is maintained through the path from the package substrate to the microwave IC. As the result, reflection of high frequency signals caused by the mismatching of characteristic impedances in the microwave transmission line is significantly reduced.

In addition, since the lower coplanar line that can be connected to the coplanar line on the package substrate is present on the rear surface of the package body, the microwave IC package is easily mounted on the package substrate by solder or the like.

According to a second aspect of the present invention, the substrate on which the microwave IC chip is to be disposed is fabricated in the following process steps. Initially, a metal plate is prepared as a conductive transmission line for connecting the IC package to the package substrate. The metal plate includes an H-shaped part, upper and lower I-shaped parts which are disposed between opposite side portions of the H-shaped part and parallel with the opposite side portions, upper connecting parts for connecting an upper end of the upper I-shaped part to upper ends of the H-shaped part, and lower connecting parts for connecting a lower end of the lower I-shaped part to lower ends of the H-shaped part. Then, the metal plate is downwardly bent at a right angle with respect to the plane surface of the metal plate, along two first lines running parallel to a horizontal portion of the H-shaped part and opposite to each other with the horizontal portion between, whereby the upper coplanar line is formed. Then, the metal plate is again bent at a right angle along two second lines running parallel to the horizontal portion of the H-shaped part and opposite to each other with the horizontal portion between so that bent portions may be parallel to the plane surface of the metal plate, whereby the intermediate coplanar line and the lower coplanar line are formed. Accordingly, the metal plate is partially encapsulated in a molded plastic so that the surface of the upper coplanar line where the IC chip is to be disposed and the rear surface of the lower coplanar line which is to be connected to the package substrate are exposed. Finally, the upper and lower connecting portions are removed. Therefore, the substrate for the IC chip is easily formed by machining and plastic molding.

According to a third aspect of the present invention, in the surface mountable microwave IC package, a radiating heat sink is disposed on the rear surface of the ground conductor on which the IC chip is disposed. Therefore, heat generated in the microwave IC chip is effectively radiated through the heat sink.

According to a fourth aspect of the present invention, in the surface mountable microwave IC package, the metal plate includes flanges formed at both ends of the upper plane part of the bent metal plate, and there are holes through the flanges, whereby a lid for shielding the microwave IC chip can be fastened to the flanges with bolts and nuts through the holes. Therefore, the packaging of the microwave IC chip is simplified.

According to a fifth aspect of the present invention, in a surface mountable microwave IC package, a substrate on which a microwave IC chip is to be disposed comprises a conductive substrate whereon a microwave IC chip is disposed and grounded and a transmission line for connecting the microwave IC chip to a microstrip line on a package substrate outside the microwave IC package. The transmission line has a microstrip line structure, in which a strip signal conductor is disposed opposite a ground conductor on a dielectric substrate, and comprises upper, lower, and intermediate microstrip lines. The upper microstrip line is disposed on the surface of the conductive substrate where the microwave IC chip is disposed. The lower microstrip line is disposed adjacent to the conductive substrate so that the rear surface thereof may be level with the rear surface of the conductive substrate. The intermediate microstrip line is disposed on the side of the conductive substrate and connects the upper microstrip line to said lower microstrip line. Therefore, the microwave transmission path from the package substrate outside the package to the microwave IC chip inside the package is the microstrip transmission line, so that a continuous transmission mode is maintained through the path from the package substrate to the microwave IC. As the result, reflection of high frequency signals caused by the mismatching of characteristic impedances in the microwave transmission line is significantly reduced.

BRIEF DESCRIPTION OF THE DRAWINGS

FIGS. 11(a)–11(c) are diagrams illustrating the surface mountable microwave IC package of FIG. 10, in which FIG. 11(a) is a bottom view, FIG. 11(b) is a side elevational view, and FIG. 11(c) is a cross-sectional view taken along a line XIc—XIc of FIG. 11(a)

DETAILED DESCRIPTION OF THE PREFERRED EMBODIMENTS

Figure 1A:
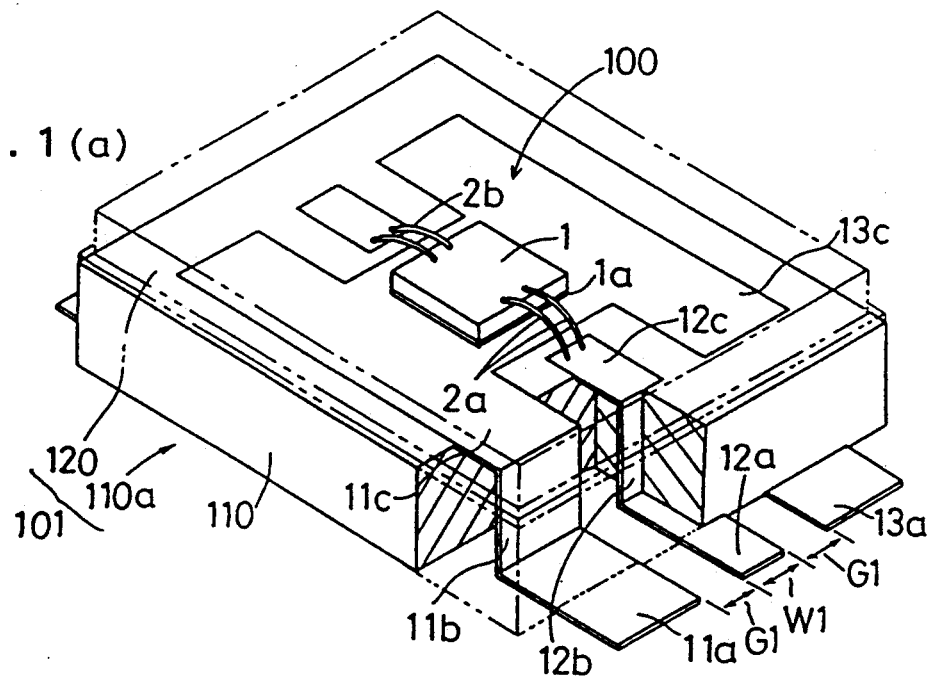
FIGS. 1(a) and 1(b) are perspective views illustrating a microwave IC package in accordance with a first embodiment of the present invention.
Figure 1B:
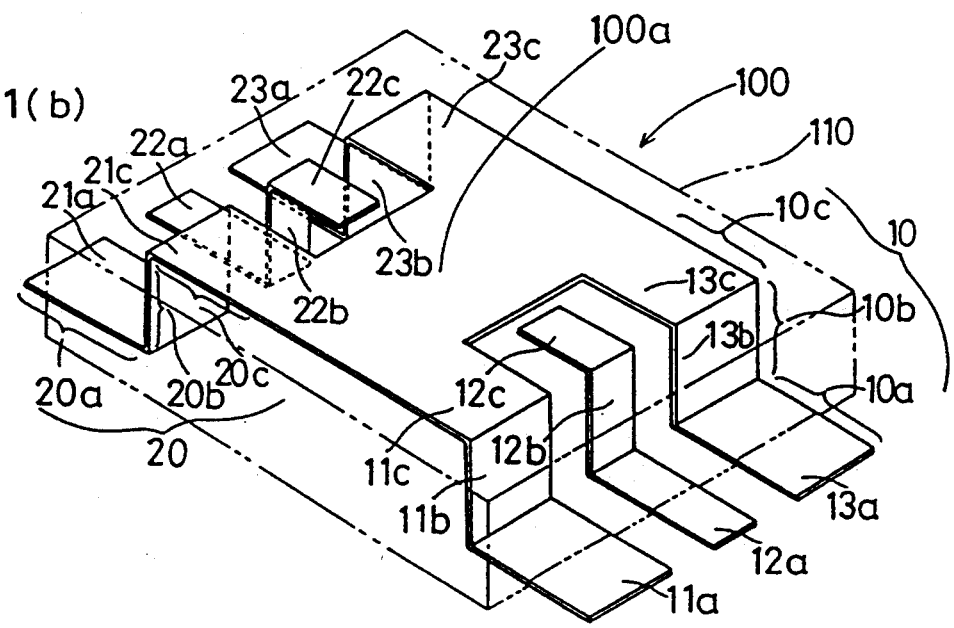
Figure 2:
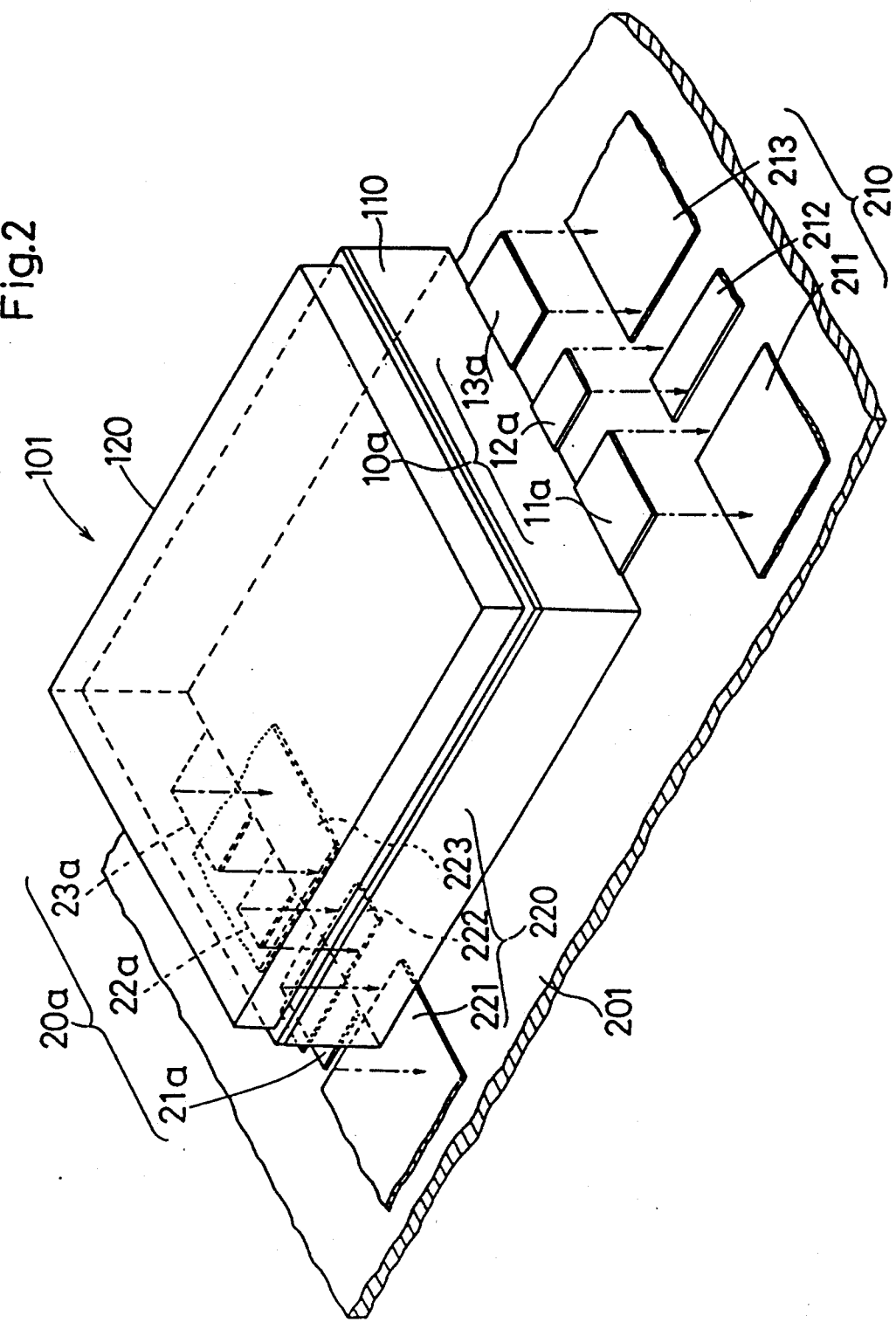
FIG. 2 is a perspective view illustrating a method of mounting the microwave IC package on a package substrate.
Figure 3A:
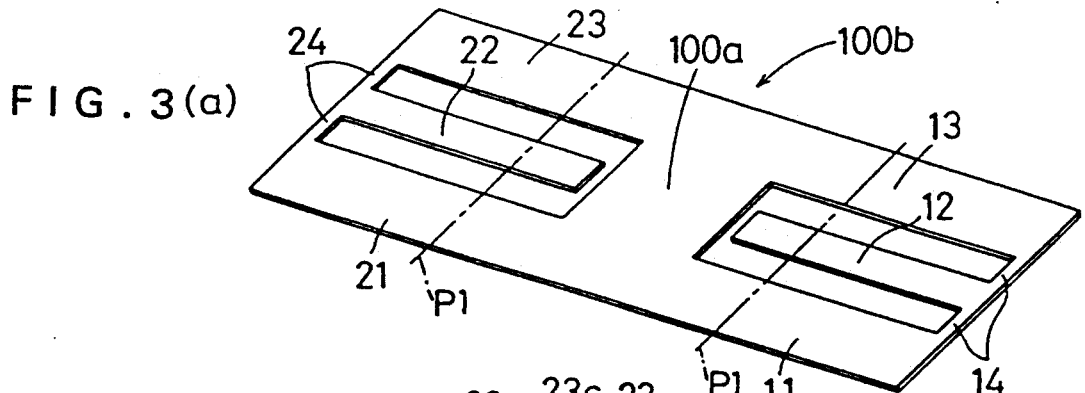
FIGS. 3(a)–3(c) are perspective views illustrating a method of forming a coplanar transmission line part included in a package body.
Figure 3B:
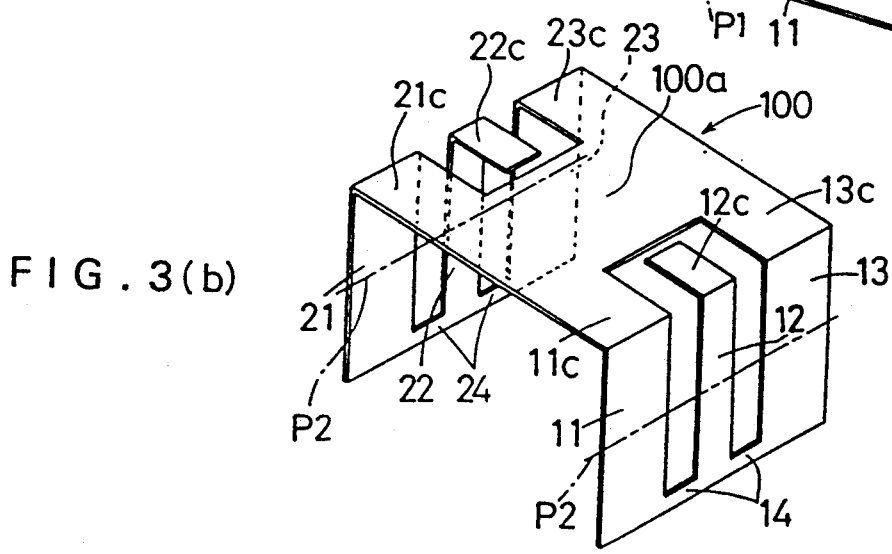
Figure 3C:
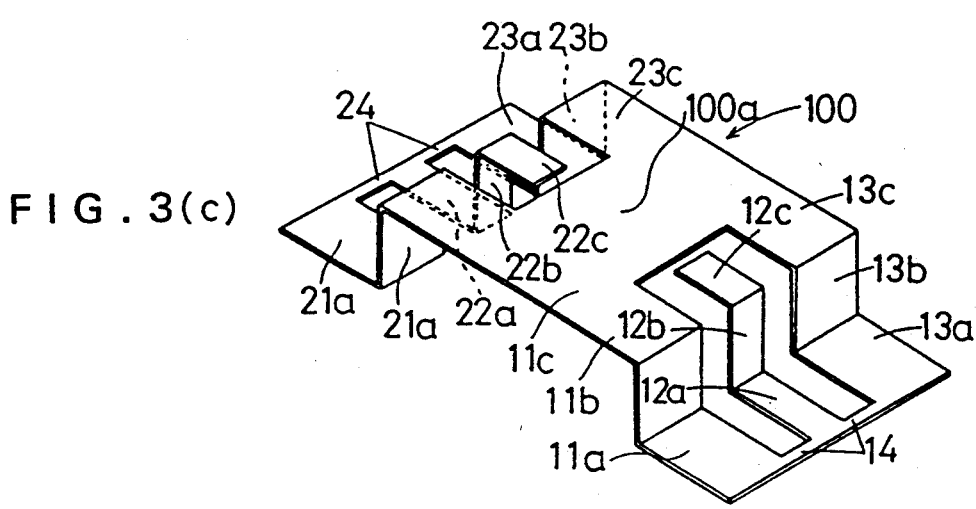
Figure 4A:
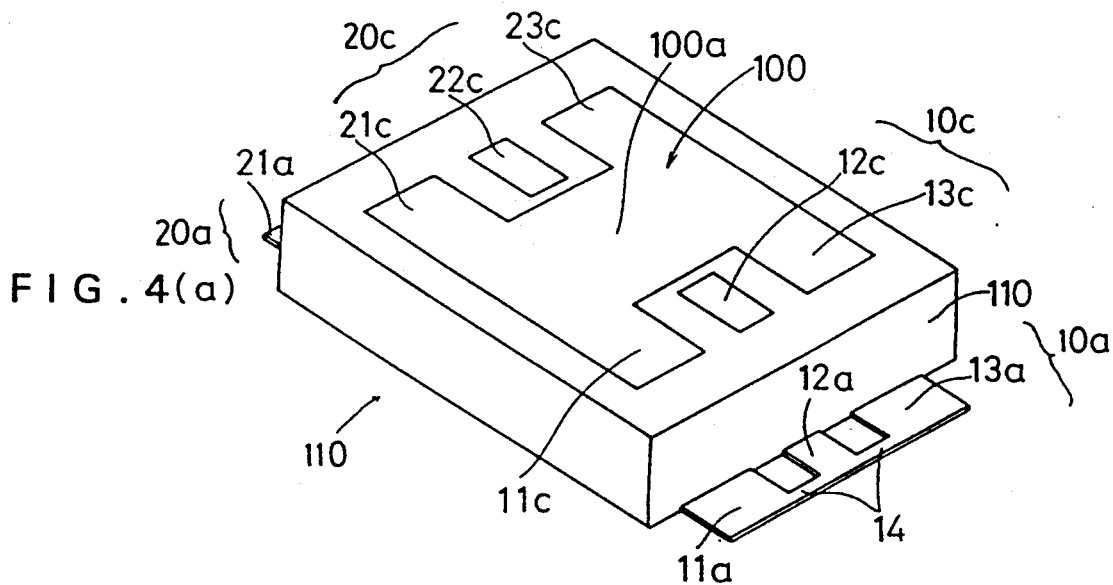
FIGS. 4(a) and 4(b) are perspective views illustrating a method of forming a dielectric substrate package body and a method of packaging the microwave IC chip, respectively.
Figure 4B:
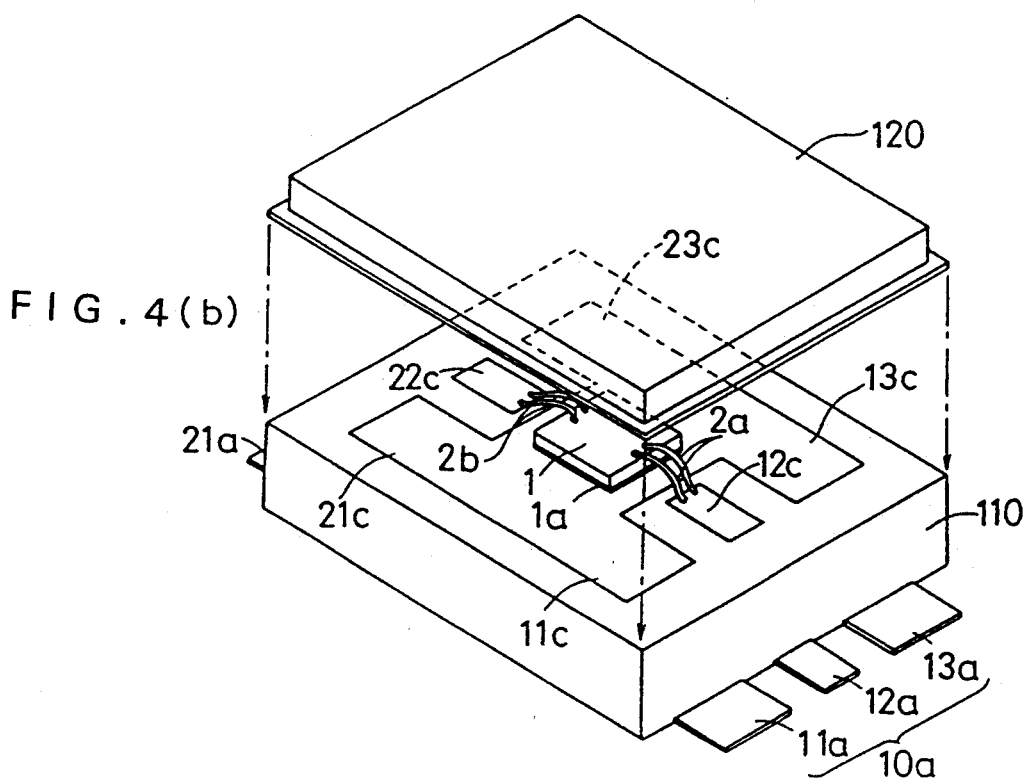

FIGS. 1(a) and 1(b) are perspective views illustrating a microwave IC package in accordance with a first embodiment of the present invention, in which FIG. 1(a) shows the external appearance and the internal structure of the package and FIG. 1(b) shows the structure of a conductor included in the package. FIG. 2 is a perspective view illustrating a method of mounting the microwave IC package on a package substrate. FIGS. 3(a)–3(c) are perspective views illustrating a method of producing the conductor of FIG. 1(b). FIGS. 4(a) and 4(b) are perspective views illustrating a method of packaging the microwave IC chip.

In these figures, the surface mountable microwave IC package 101 comprises a package body 110a on which a microwave IC chip 1 is to be disposed and a lid 120 put on the package body 110a. The lid 120 provides both a hermetic seal and shielding.

The package body 110a comprises a dielectric substrate 110, a ground conductor 100a on which the microwave IC chip 1 is mounted and grounded, and input side and output side transmission lines 10 and 20. The chip 1 is connected to input and output coplanar lines 210 and 220 on a package substrate 201 through the transmission lines 10 and 20, respectively. Each transmission line has a conventional coplanar line structure in which coplanar signal and ground conductors are disposed on the same plane of the dielectric substrate.

The input side transmission line 10 comprises an upper coplanar transmission line part 10c, a lower coplanar transmission line part 10a, and an intermediate coplanar transmission line part 10b. More specifically, the upper coplanar transmission line part 10c is disposed on the front surface of the dielectric substrate 110 and connected to the microwave IC chip 1. The lower coplanar transmission line part 10a is disposed on the rear surface of the dielectric substrate 110 so that it can be connected to the input side coplanar line 210 on the package substrate 201. The intermediate coplanar transmission line part 10b penetrates through the dielectric substrate 110 and connects the upper coplanar transmission line part 10c to the lower coplanar transmission line part 10a. The coplanar transmission parts 10a to 10c comprise coplanar signal conductors 12a to 12c and ground conductors 11a to 11c and 13a to 13c, respectively.

In addition, the output side transmission line 20 comprises an upper coplanar transmission line part 20c, a lower coplanar transmission line part 20a, and an intermediate coplanar transmission line part 20b. More specifically, the upper coplanar transmission line part 20c is disposed on the front surface of the dielectric substrate 110 and connected to the microwave IC chip 1. The lower coplanar transmission line part 20a is disposed on the rear surface of the dielectric substrate 110 so that it can be connected to the output side coplanar line 220 on the package substrate 201. The intermediate coplanar transmission line part 20b penetrates through the dielectric substrate 110 and connects the upper coplanar transmission line part 20c to the lower coplanar transmission line part 20a. The coplanar transmission parts 20a to 20c comprise coplanar signal conductors 22a to 22c and grounding conductors 21a to 21c and 23a to 23c, respectively.

A description is given of a method of forming the microwave IC package.

Initially, a metal plate 100 shown in FIG. 3(a) is prepared. This metal plate 100 comprises an H-shaped part 100b, an upper I-shaped part 22 between upper portions 21 and 23 of the H-shaped part 100b, a lower I-shaped part 12 between lower portions 11 and 13 of the H-shaped part 100b, upper connecting parts 24 connecting an upper end of the I-shaped part 22 to upper ends of the portions 21 and 23, and lower connecting parts 24 connecting a lower end of the I-shaped part 12 and lower ends of the portions 11 and 13.

Then, as illustrated in FIG. 3(b), the metal plate 100 is downwardly bent at right angles with respect to the plane surface of the metal plate 100 along dashed lines P1 of FIG. 3(a) to form the signal conductors 12c and 22c and the ground conductors 11c, 13c, 21c, and 23c of the upper coplanar transmission parts 10c and 20c.

Then, as illustrated in FIG. 3(c), the metal plate 100 is again bent at right angles along dashed lines P2 of FIG. 3(b) so that bent portions are parallel to the planar front surface of the metal plate, to form the signal conductors 12b and 22b and the ground conductors 11b, 13b, 21b, and 23b of the intermediate coplanar transmission parts 10b and 20b and the signal conductors 12a and 22a and the ground conductors 11a, 13a, 21a, and 23a of the lower coplanar line parts 10a and 20a.

Then, the processed metal plate 100 is partially encapsulated in a molded plastic to form the dielectric substrate 110 as shown in FIG. 4. More specifically, the molding should be carried out so that the surfaces of the ground conductor 100a and the upper coplanar transmission parts 10c and 20c are level with the front surface of the dielectric substrate 110, and the rear surfaces of the lower coplanar transmission parts 10a and 20a are level with the rear surface of the dielectric substrate 110.

After the connecting portions 14 and 24 are removed, the microwave IC chip 1 is bonded to the ground conductor 100a, and electrode pads of the chip 1 are connected to the signal conductors 12c and 22c of the input and output side upper coplanar transmission parts 10c and 20c by metal wires 2a and 2b comprising Au or the like, respectively. Then, the lid 12 is put on the package body 110 to cover the IC chip 1 and adhered to the package body 110 with solder or the like (FIG. 4(b)). Thus, a surface mountable microwave IC package is achieved.

A Kovar plate or the like onto which Au is plated to a thickness of about several microns is used as the metal plate 100. In addition, the characteristic impedance of each coplanar transmission line part is determined by the interval G1 between the ground conductor and the coplanar signal conductor, the width W1 of the signal conductor, and the dielectric constant $\epsilon r$ of the dielectric substrate. For example, when the dielectric substrate is formed of an epoxy resin having a dielectric constant $\epsilon r = 4$ and the thickness of the substrate is 0.5 mm, a characteristic impedance of 50Ω is obtained by setting the interval G1 to 100 microns and the width W1 to 760 microns.

Although epoxy resin is used as a material of the dielectric substrate in the above-described first embodiment, glass or ceramic may be used. In the case of using glass or ceramic, transfer molding or sintering is preferably employed to form the dielectric substrate.

A method of mounting the microwave IC package 101 on the package substrate 201 will be described. The microwave IC package 101 is put on the substrate 201 so that the signal conductor 12a and the ground conductors 11a and 13a of the input side lower coplanar transmission line part 10a may be laid on the signal conductor 212 and the ground conductors 211 and 213 of the signal supply side coplanar line 210 of the package substrate 201, respectively, and the signal conductor 22a and the ground conductors 21a and 23a of the output side lower coplanar transmission line part 20a may be laid on the signal conductor 222 and the ground conductors 221 and 223 of the signal transfer side coplanar line 220, respectively. Then, the respective contacting parts are fixed with solder or the like, whereby the microwave IC package 101 is mounted on the package substrate 201.

In operation, a microwave signal input is transferred to the lower coplanar transmission line part 10a serving as an input terminal from the signal supply side coplanar line 210. The microwave signal travels through the lower coplanar transmission line part 10a, the intermediate coplanar transmission line part 10b, the upper coplanar transmission line part 10c, and the bonding wire 2a to reach the microwave IC chip 1.

In the IC chip 1, the microwave signal is subjected to a prescribed signal processing, such as amplification, switching, phase modulation, or the like according to the function of the IC chip 1 and then it is output from the IC chip 1. Then, the microwave signal output travels through the bonding wire 2b, the upper coplanar transmission line part 20c, and the intermediate coplanar transmission line part 20b to reach the lower coplanar transmission line part 20a. Then, it is output to the signal transfer side coplanar line 220 on the package substrate 201.

According to the first embodiment of the present invention, the input and output side coplanar transmission parts 10c and 20c on the front surface of the dielectric substrate 110 are connected to the input and output side coplanar transmission parts 10a and 20a on the rear surface of the dielectric substrate 110 by the intermediate coplanar transmission parts 10b and 20b penetrating through the dielectric substrate 110. Therefore, the microwave transmission path from the package substrate 201 outside the package 101 to the microwave IC chip 1 inside the package 101 is a coplanar transmission line, so that a continuous transmission mode is maintained through the path from the package substrate 201 to the microwave IC. As the result, reflection of high frequency signals caused by the mismatching of characteristic impedances in the microwave transmission line is significantly reduced.

Figure 5:
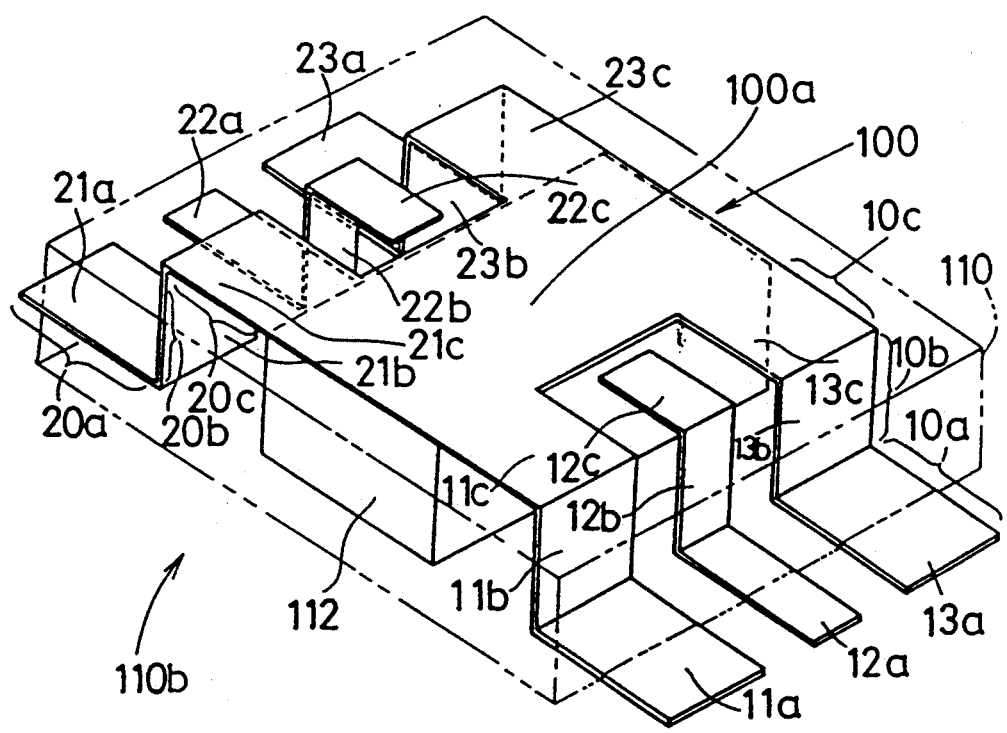
FIG. 5 is a perspective view illustrating a structure of a microwave IC package in accordance with a second embodiment of the present invention.

FIG. 5 is a perspective view for explaining an microwave IC package in accordance with a second embodiment of the present invention. In this embodiment, a radiating heat sink 112 is disposed beneath the ground conductor 100a on which an IC chip is to be disposed. Other structures are the same as those in the above-described first embodiment.

More specifically, the heat sink 112 comprising an alloy of copper and tungsten, Kovar, or the like is adhered to the rear surface of the ground conductor part 100a of the metal plate 100, which is bent as shown in FIG. 5, by solder or the like. Thereafter, the metal plate 100 with the heat sink 112 is encapsulated in molded plastic to form the package body 110b. In FIG. 5, the lid 120 is omitted.

According to the second embodiment of the present invention, since the heat sink 112 is present directly under the ground conductor 100a on which a microwave IC chip (not shown) is disposed, heat generated in the microwave IC chip is effectively radiated through the heat sink, providing a surface mountable package suitable for a high power microwave IC chip.

Figure 6:
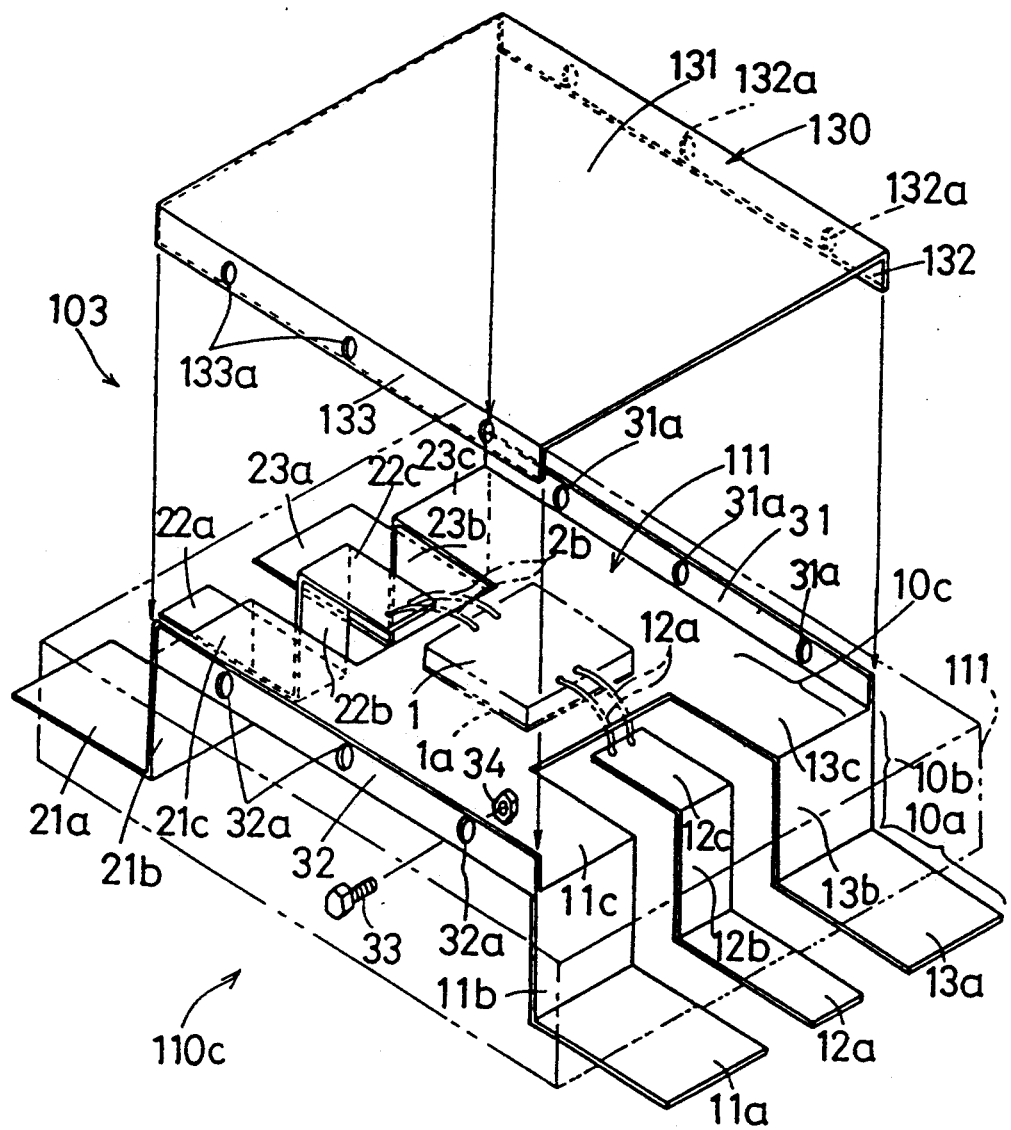
FIG. 6 is a perspective view illustrating a structure of a microwave IC package in accordance with a third embodiment of the present invention.

FIG. 6 is a perspective view for explaining a microwave IC package in accordance with a third embodiment of the present invention. In this third embodiment, a lid 130 for shielding the IC chip 1 is screwed to the package body 110c.

More specifically, the metal plate 100 includes flanges 31 and 32 upwardly bent with respect to the plane surface of the metal plate, and holes 31a and 32a are formed through the flanges 31 and 32, respectively. A lid 130 comprises a plane part 131 and flanges 132 and 133 downwardly bent with respect to the plane part 131. Holes 132a and 133a through the flanges 132 and 133 are located at positions corresponding to the holes 31a and 32a of the flanges 31 and 32 of the package body 110c, respectively.

In fabrication, the microwave IC chip 1 is disposed on the metal plate 100 and encapsulated in a molded plastic to form the dielectric substrate 111. Then, the lid 130 is put on the substrate 111, and the flanges 132 and 133 of the lid is fastened to the flanges 31 and 32 of the metal plate 100 with bolts 33 and nuts 34.

According to the third embodiment of the present invention, in addition to the effects of the first embodiment, the lid 130 is easily fixed onto the package body with bolts and nuts.

Figure 7:
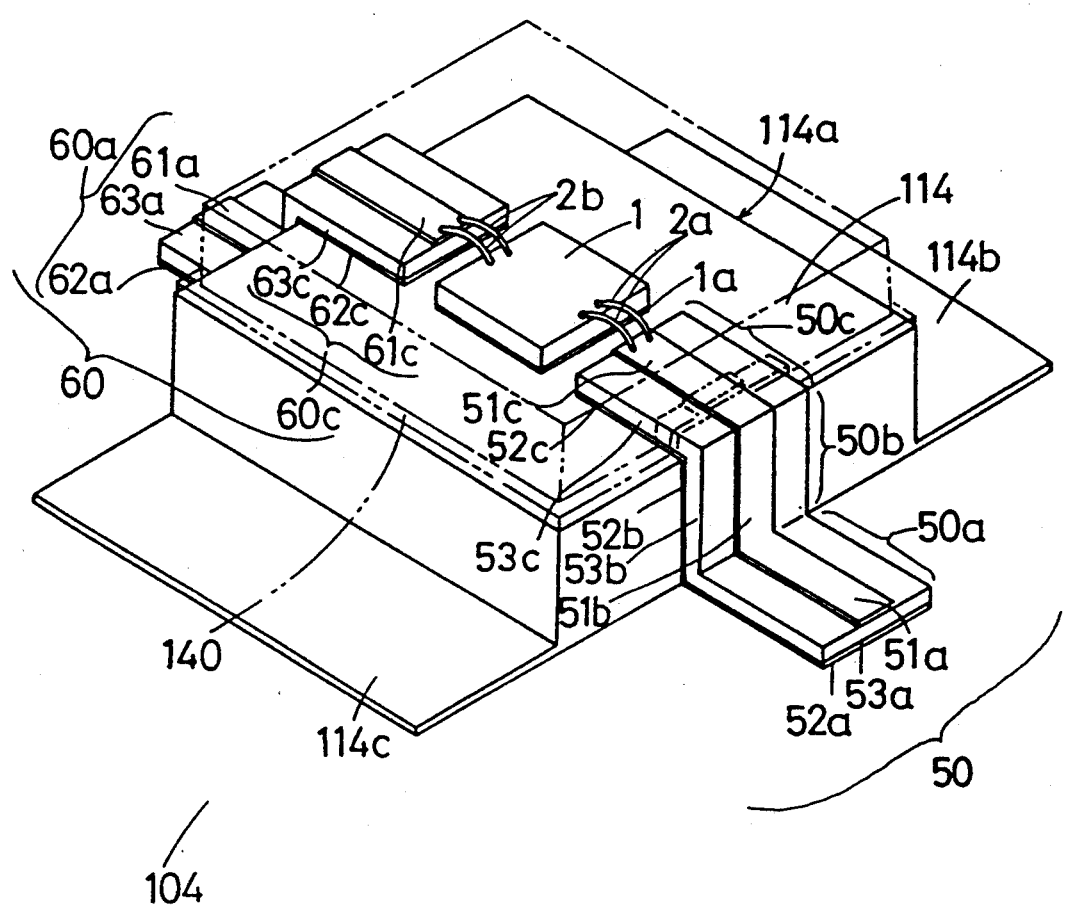
FIG. 7 is a perspective view illustrating an external appearance of a microwave IC package in accordance with a fourth embodiment of the present invention.
Figure 8:
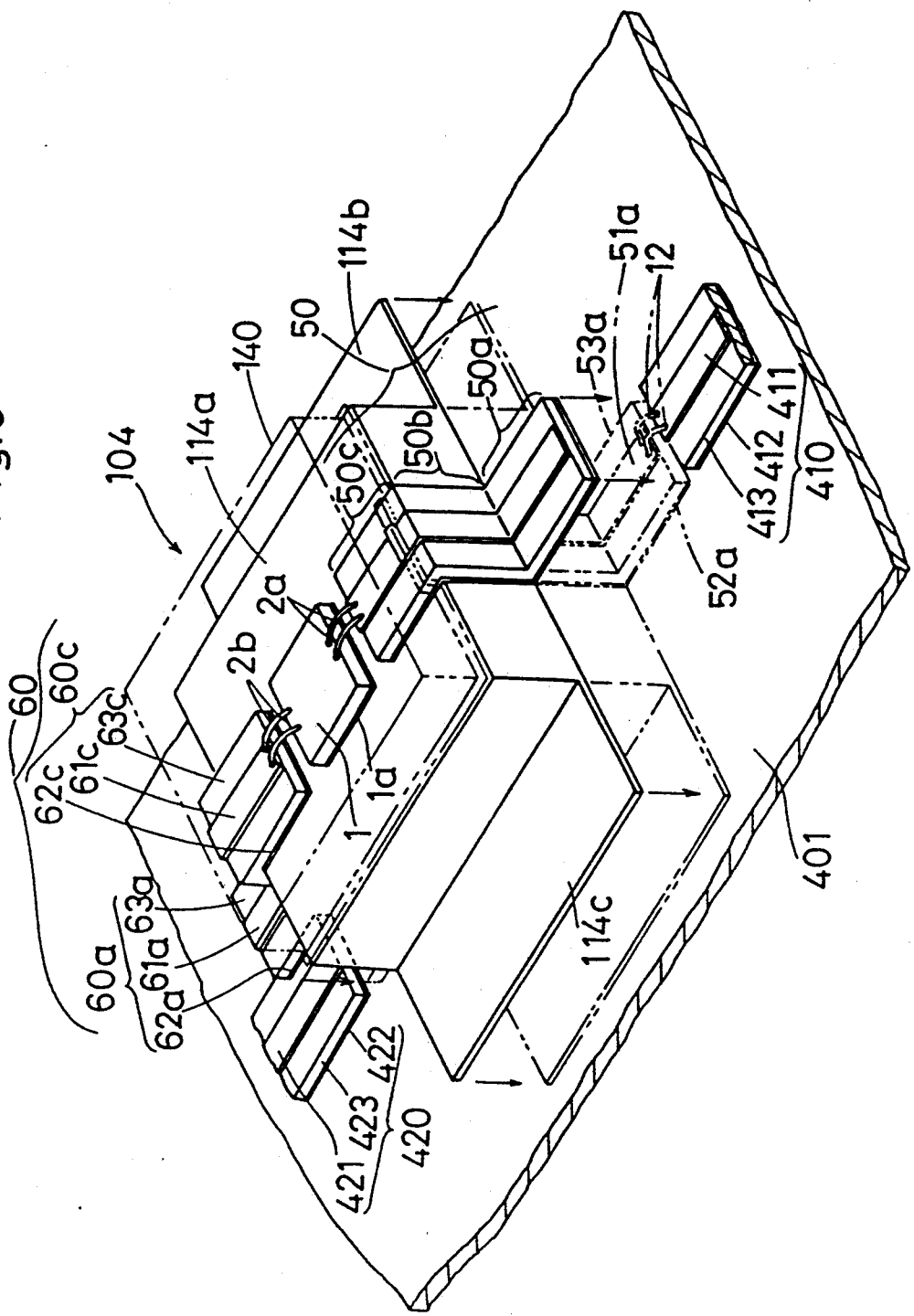
FIG. 8 is a perspective view illustrating a method of mounting the package of FIG. 7 on a package substrate.
Figure 9:
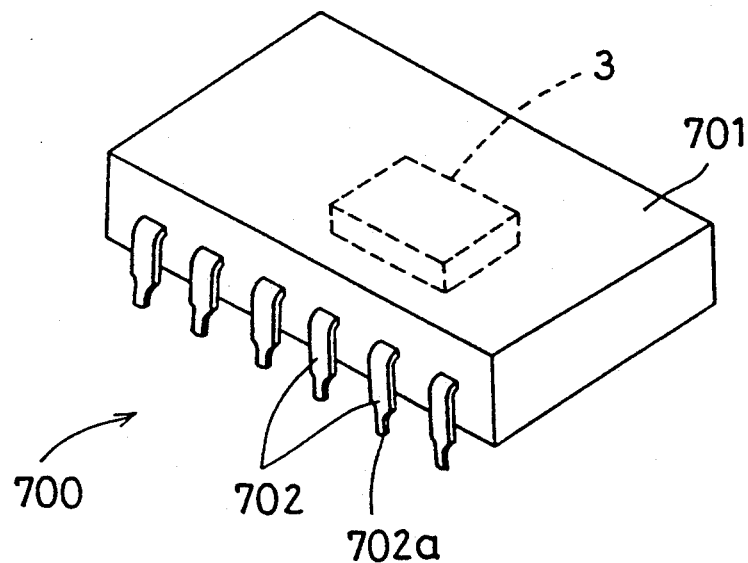
FIGS. 9(a) and 9(b) are perspective views illustrating a plastic molded package and a surface mountable package, respectively, in accordance with the prior art.
Figure 9:
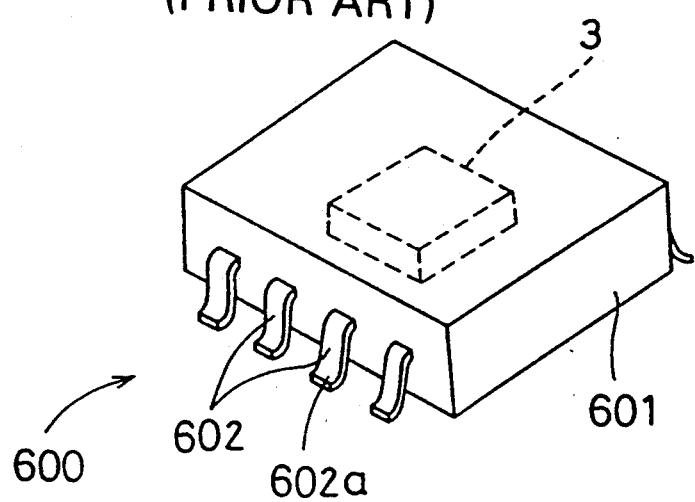
Figure 10:
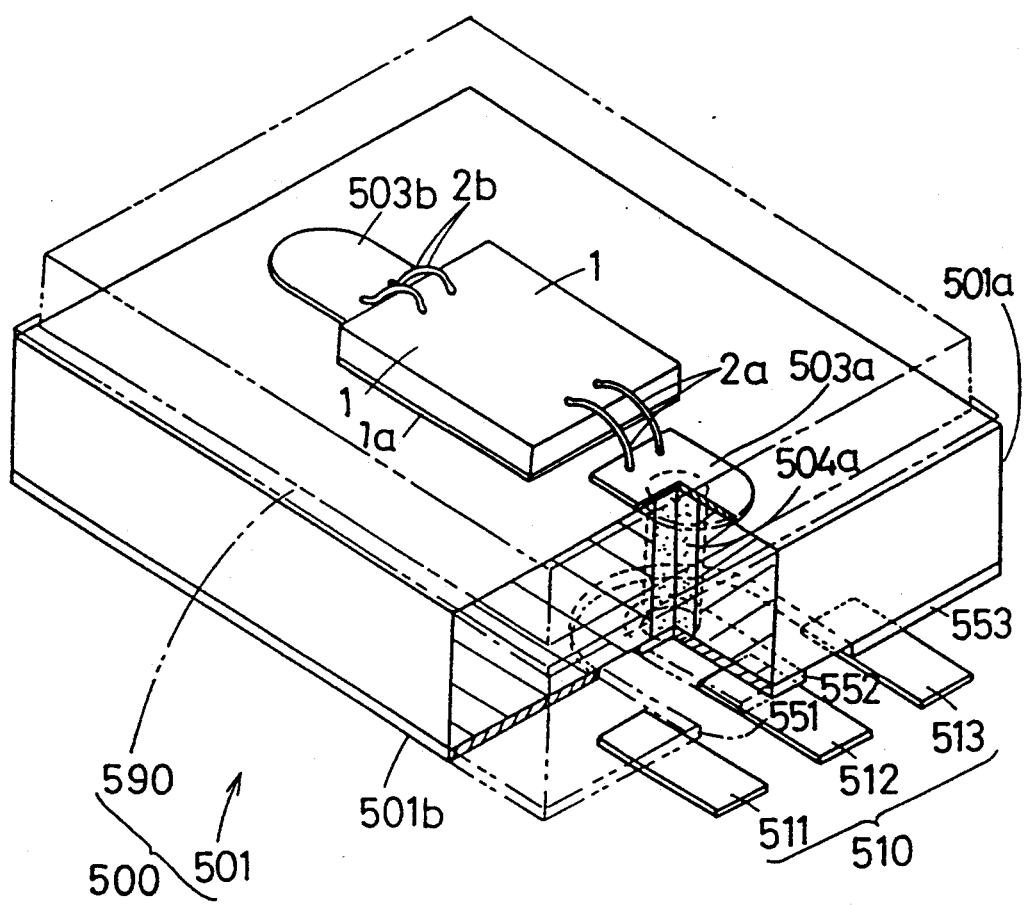
FIG. 10 is a perspective view, partly broken away, illustrating a surface mountable microwave IC package according to the prior art.
Figure 11A:
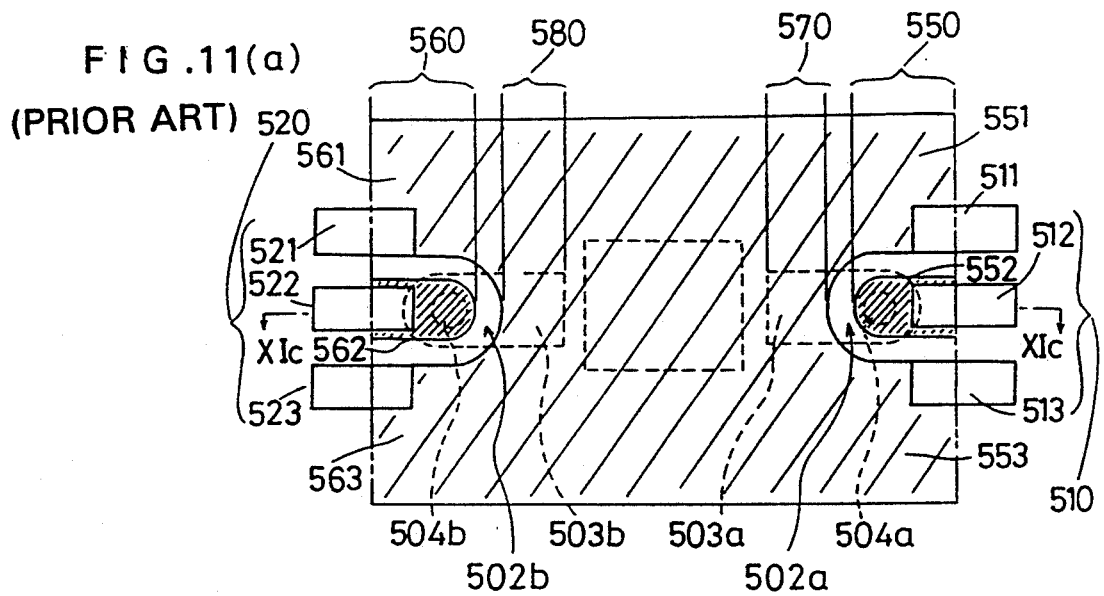
Figure 11B:
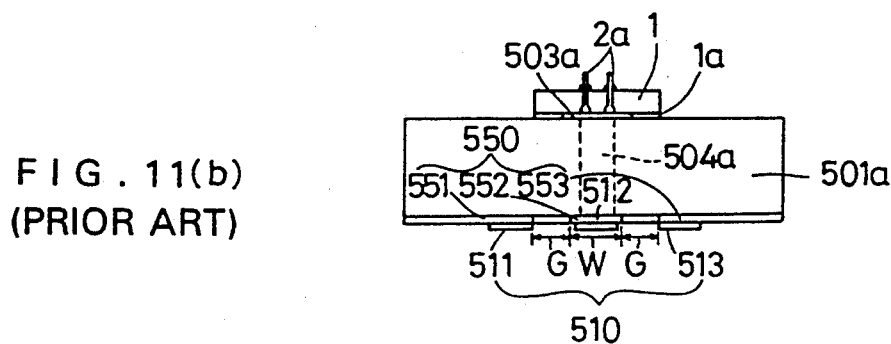
Figure 11C:
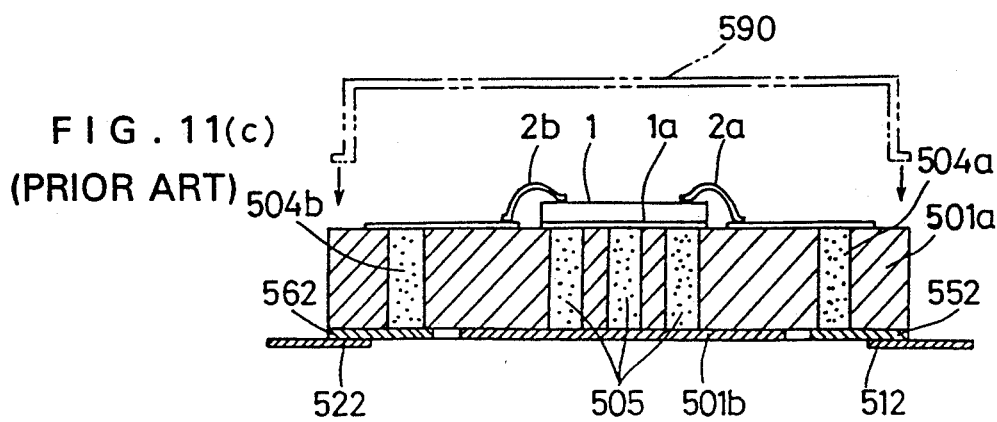
Figure 12A:
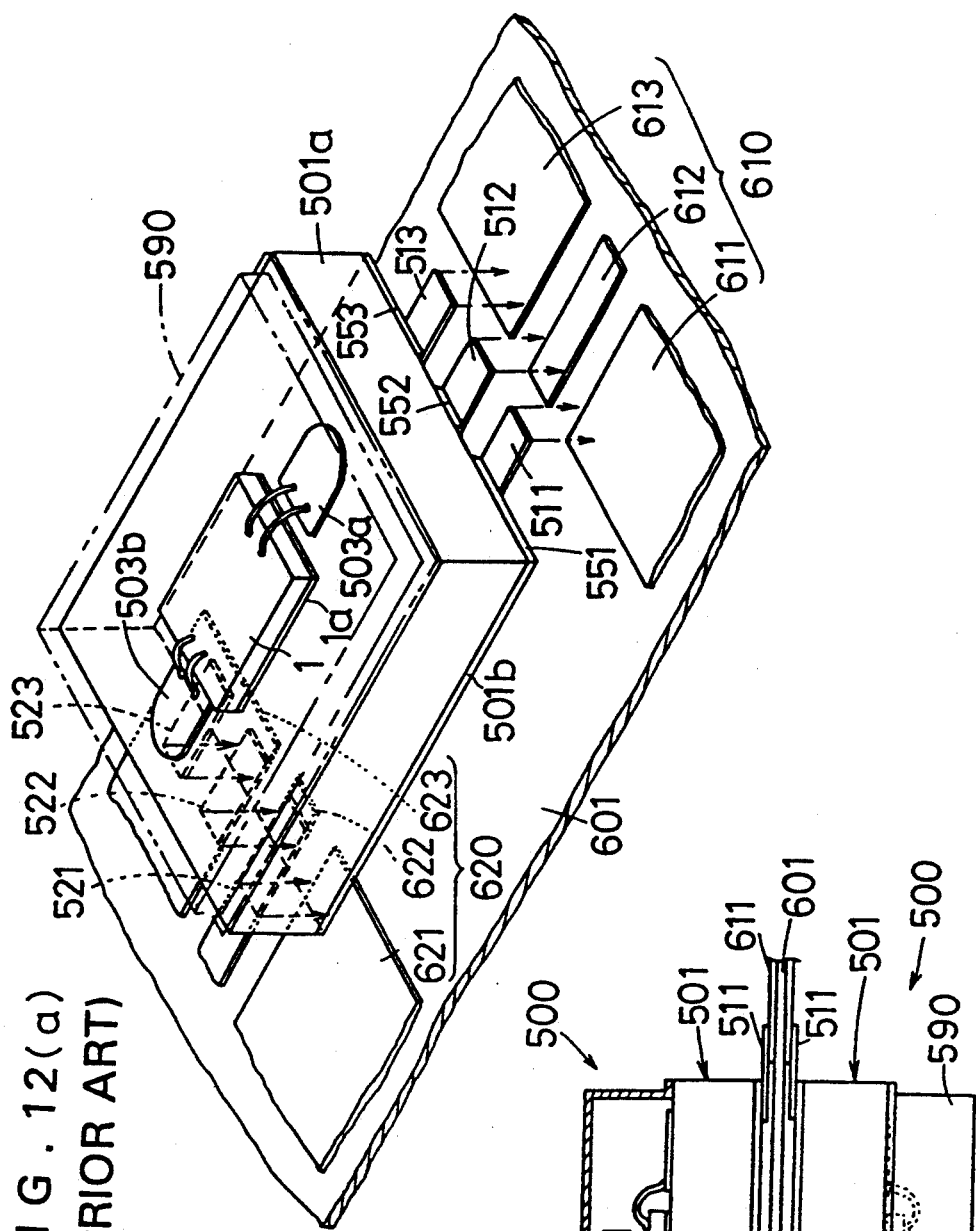
FIGS. 12(a) and 12(b) are a perspective view and a front elevational view, respectively, for explaining a method of mounting the surface mountable microwave IC package of FIG. 10 on a package substrate.
Figure 12B:
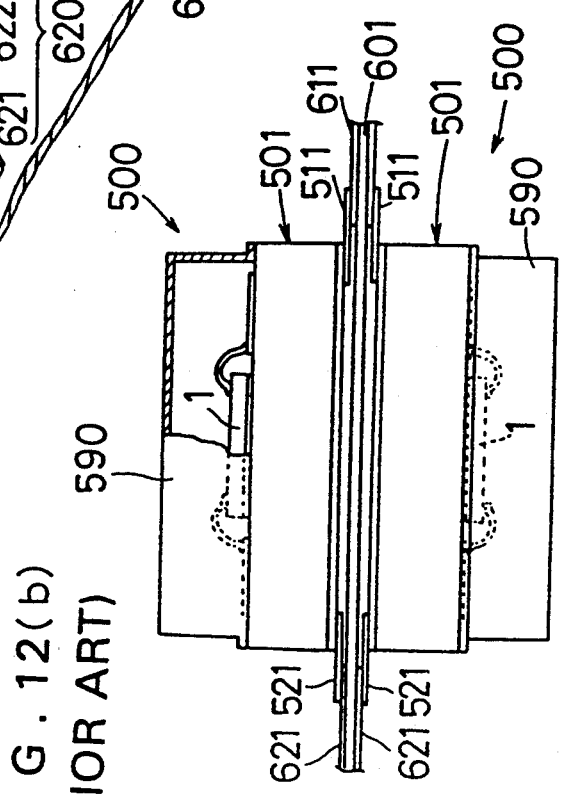

FIGS. 7 and 8 are perspective views for explaining a microwave IC package in accordance with a fourth embodiment of the present invention. In this fourth embodiment, a package body 114a comprises a conductive substrate 114 on which the microwave IC chip 1 is disposed and grounded and input and output side transmission lines 50 and 60 for connecting the microwave IC chip 1 to microwave transmission lines 410 and 420 on a package substrate 401.

The grounding conductive substrate 114 comprises a metal, such as an alloy of copper and tungsten, Kovar, or the like, onto which Au is plated. The input side transmission line 50 has a conventional microstrip line structure in which a strip signal conductor is disposed on a dielectric that contacts a ground conductor. More specifically, the transmission line 50 comprises an upper microstrip transmission line part 50c, a lower microstrip transmission line part 50a, and an intermediate microstrip transmission line part 50b. The upper microstrip transmission line part 50c is disposed on the front surface of the conductive substrate 114 where the microwave IC chip 1 is to be disposed. The lower microstrip transmission line part 50a is adjacent to the conductive substrate 114, and the rear surface of the ground conductor thereof is level with the rear surface of the conductive substrate 114. The intermediate microstrip transmission line part 50a is disposed on the side of the conductive substrate 114 and connects the upper microstrip transmission line part 50c to the lower microstrip transmission line part 50a.

The output side transmission line 60 comprises a microstrip transmission line part 60c *disposed* on the front surface of the conductive substrate 114, a lower microstrip transmission line part 60a whose rear surface is level with the rear surface of the conductive substrate 114, and an intermediate microstrip transmission line part 60b (not shown) connecting the upper microstrip line 60c to the lower microstrip line 50a.

The input side lower, intermediate and upper microstrip lines 50a, 50b, and 50c respectively comprise dielectric layers 53a, 53b, and 53c comprising polyimide or the like, ground conductors 52a, 52b, and 52c disposed on the rear surface of the dielectric layers, and strip signal conductors 51a, 51b, and 51c disposed on the front surface of the dielectric layers. The output side lower, intermediate and upper microstrip lines 60a, 60b, and 60c respectively comprise dielectric layers 63a, 63b, and 63c, ground conductors 62a, 62b, and 62c, and strip signal conductors 61a, 61b, and 61c. In addition, a lid 140 is put on the package body 114 to cover the microwave IC chip 1. Soldering portions 114b *and* 114c are connected to the package substrate 401 with solder, and thus the package 104 is adhered onto the package substrate 401.

The input and output side transmission lines 50 and 60 are adhered to the conductive substrate 114 with a conductive resin or the like. When polyimide ($\epsilon r = 3.5$) is used as the dielectric layer, the characteristic impedance of each microstrip line can be set to 50$\Omega$ by making the thickness of the dielectric layer 50 microns and the width of the strip signal conductor 95 microns.

Thus formed microwave IC package 104 is mounted on the package substrate 401 whose surface is metallized a shown in FIG. 8. That is, it is mounted so that the input and output side lower microstrip lines 50a and 60a may be laid on the signal supply side and signal transfer side microstrip lines 410 and 420, respectively. At this time, the conductive substrate 114 and the ground conductors 52a and 62a are adhered to the surface of the package substrate 401 with a conductive adhesive or the like.

Then, the strip signal conductors 51a and 61a of the package are connected to the strip signal conductors 411 and 421 of the package substrate by bonding wires 12, respectively. The microstrip line 410 of the package substrate comprises a ground conductor 412 and a dielectric layer 422, and the microstrip line 420 comprises a ground conductor 413 and a dielectric layer 423.

According to the fourth embodiment of the present invention, the microstrip transmission parts 50c and 60c disposed on the front surface of the conductive substrate 114 and the microstrip transmission parts 50a and 60a whose rear surfaces are level with the rear surface of the conductive substrate 114 are connected by the intermediate microstrip transmission parts 50b and 60b disposed on the opposite side surfaces of the substrate 114, respectively. Therefore, the microwave transmission path from the package substrate 401 outside the package to the microwave IC chip 1 inside the package is produced by the microstrip line, whereby a continuous transmission mode is maintained through the path from the package substrate 401 to the microwave IC chip 1. As the result, the reflection of high frequency signals caused by the mismatching of characteristic impedances in the microwave transmission path is significantly reduced.

Furthermore, in the package 104, the conductive substrate is used as the package body 114a, the heat radiating property of the package is improved, and this package is suitable for a high power microwave IC chip.

As is evident from the foregoing description, according to the present invention, the upper coplanar line formed on the front surface of the IC chip substrate is connected to the lower coplanar line disposed on the rear surface of the IC chip substrate, which is to be connected to the transmission line on the package substrate, by an intermediate coplanar line penetrating through the IC chip substrate. Therefore, the microwave transmission path from the package substrate outside the package to the microwave IC chip inside the package is a coplanar transmission line, so that a continuous transmission mode is maintained through the path from the package substrate to the microwave IC. As the result, reflection of high frequency signals caused by the mismatching of characteristic impedances in the microwave transmission line is significantly reduced.

In addition, since the lower coplanar line that can be connected to the coplanar line on the package substrate is present on the rear surface of the package body, the microwave IC package is easily mounted on the package substrate with solder or the like.

In addition, a method of fabricating the IC chip substrate includes preparing a metal plate patterned in a shape corresponding to ground conductors and signal conductors of the coplanar transmission line, bending the metal plate, partially encapsulating the metal plate in a molded plastic, and removing unnecessary portions of the metal plate. Therefore, the IC chip substrate is easily formed by machining and plastic molding.

In addition, the radiating heat sink is disposed on the rear surface of the ground conductor on which the IC chip is disposed. Therefore, heat generated in the microwave IC chip is effectively radiated through the heat sink.

In addition, the metal plate includes flanges at both ends of the upper plane part of the bent metal plate, and holes in the flanges, whereby a lid for shielding the microwave IC chip can be fastened to the flanges with bolts and nuts using the holes. Therefore, the packaging of the microwave IC chip is simplified.

Furthermore, according to the present invention, the upper microstrip line on the front surface of the IC chip substrate is connected to the lower microstrip line disposed on the rear surface of the IC chip substrate, which is to be connected to the transmission line on the package substrate, by the intermediate microstrip line disposed on the side of the IC chip substrate. Therefore, the microwave transmission path from the package substrate outside the package to the microwave IC chip inside the package is produced by the microstrip transmission line, so that a continuous transmission mode is maintained through the path from the package substrate to the microwave IC. As the result, reflection of high frequency signals caused by mismatching of characteristic impedances in the microwave transmission line is significantly reduced.

What is claimed is:

1. A surface mountable microwave IC package comprising:
    a dielectric substrate having opposed front and rear surfaces;
    a ground conductor disposed on the front surface of said dielectric substrate to which a microwave IC chip may be mounted and grounded; and
    a transmission line for connecting a microwave IC chip mounted on said ground conductor to a coplanar line on an external package substrate outside the microwave IC package wherein said transmission line has a coplanar line structure including a signal conductor and a ground conductor disposed on said dielectric substrate and comprising:
    an upper coplanar line disposed on the front surface of said dielectric substrate including said ground conductor;
    a lower coplanar line disposed on the rear surface of said dielectric substrate; and
    an intermediate coplanar line penetrating through said dielectric substrate and connecting said upper coplanar line to said lower coplanar line.

2. The microwave IC package of claim 1 wherein said dielectric substrate is formed by:
    preparing a metal plate as said conductive transmission line for connecting the IC package to a package substrate including an H-shaped part, upper and lower I-shaped parts which are disposed between and parallel to opposite side portions of said H-shaped part, upper connecting parts connecting an upper end of said upper I-shaped part to upper ends of said H-shaped part, and lower connecting parts connecting a lower end of said lower I-shaped part to lower ends of said H-shaped part;
    bending said metal plate along two first lines parallel to a horizontal portion of said H-shaped part and opposite to each other with said horizontal portion between, whereby said upper coplanar line is formed;
    bending said metal plate along two second lines parallel to said horizontal portion of said H-shaped part and opposite to each other with said horizontal portion between so that bent portions are parallel to the plane surface of the metal plate, whereby said intermediate coplanar line and said lower coplanar line are formed;
    partially encapsulating said metal plate in a plastic so that the surface of said upper coplanar line where the microwave IC chip is to be disposed and the rear surface of said lower coplanar line which is to be connected to the package substrate are exposed; and
    removing said upper and lower connecting parts.

3. The microwave IC package of claim 1 wherein said transmission line for connecting the microwave IC package to a package substrate includes an input side transmission line comprising said upper, lower, and intermediate coplanar lines for connection to a signal supply side coplanar line on a package substrate and an output side transmission line comprising said upper, lower, and intermediate coplanar lines for connection to a signal transfer side coplanar line on a package substrate.

4. The microwave IC package of claim 1 comprising a lid for hermetically sealing and shielding a microwave IC chip in said package.

5. The microwave IC package of claim 1 comprising a radiating heat sink contacting said ground conductor on which said IC chip is disposed.

6. The microwave IC package of claim 2 wherein said ground conductor includes flanges with holes and including a lid for shielding the microwave IC chip and for fastening to said flanges with bolts passing through the holes.

7. A surface mountable microwave IC package comprising:
    a conductive substrate having a front surface on which a microwave IC chip may be mounted and grounded and an opposed rear surface; and
    a transmission line for connecting a microwave IC chip mounted on said substrate to a microstrip transmission line on a package substrate wherein said transmission line has a microstrip line structure including a ground conductor, a dielectric substrate disposed on said ground conductor, and a strip signal conductor disposed on said ground conductor through said dielectric substrate and comprising:
    an upper microstrip line disposed on the front surface of said conductive substrate;

a lower microstrip line disposed adjacent to said conductive substrate level with the rear surface of said conductive substrate; and an intermediate microstrip line disposed on said conductive substrate and connecting said upper microstrip line to said lower microstrip line.

8. The microwave IC package of claim 7 wherein said transmission line for connecting the IC chip to a package substrate includes an input side transmission line comprising said upper, lower, and intermediate microstrip lines for connection to a signal supply side microstrip line on the package substrate and an output side transmission line comprising said upper, lower, and intermediate microstrip lines for connection to a signal transfer side microstrip line on the package substrate.

9. The microwave IC package of claim 8 comprising a lid hermetically sealed to said conductive substrate for sealing and shielding a microwave IC chip in said package.

* * * * *